SYNCHRONIZED OSCILLATOR

Filed May 26, 1955

INVENTOR
VICTOR J. MODIANO
BY R. W. Craddock
ATTORNEY 2,772,359
Patented Nov. 27, 1956

2,772,359

SYNCHRONIZED OSCILLATOR

Victor J. Modiano, Los Angeles, Calif., assignor to Sperry Rand Corporation, a corporation of Delaware Application May 26, 1955, Serial No. 511,218
8 Claims. (Cl. 250—36)

This invention relates to gated oscillators, and more particularly, is concerned with a transistorized sine wave oscillator which can be synchronized with a remote oscillator.

It is the general object of this invention to provide an improved oscillator circuit which can be gated on and off, and which can be synchronized with a remote oscillator.

Another object of the invention is the provision of an oscillator which can be gated off in a half cycle of its oscillations.

Another object of this invention is to provide an oscillator that starts at the same point in its cycle when gated on.

Another object of this invention is the provision of a gated sine wave oscillator circuit utilizing transistors throughout.

These and other objects of the invention which will become apparent as the description proceeds are achieved by the provision of an oscillator circuit comprising a tank circuit, with the collector-to-emitter circuit of a transistor and a resistor connected in series with the tank circuit across a potential source. The base of a second transistor is directly coupled from the collector of the first transistor with the collector of the second transistor being coupled back to the base of the first transistor to provide a two-stage regenerative amplifier for maintaining oscillation in the tank circuit. The base current of the first transistor is increased in response to a received synchronizing pulse, a monostable multivibrator being used to maintain the increased base current for a half cycle of oscillation of the tank circuit. The increased base current reduces the collector-to-emitter impedance of the first transistor, the series resistor limiting the minimum damping impedance across the tank circuit to a value half of the square root value of the inductance to the capacitance ratio of the tank circuit.

For a better undersatnding of the invention, reference should be had to the accompanying drawings, wherein.

The purpose of this invention is to produce a local oscillator whose output is synchronized with the output of a remote oscillator. This is accomplished according to the present invention by providing a local free running oscillator which is gated off periodically in response to synchronizing pulses received from the remote oscillator, the synchronizing pulses having a fixed phase relationship with the output signal from the remote oscillator. The local free running oscillator is gated on again and oscillation resumed at a predetermined phase relationship with the remote oscillator signal. This gating process in response to synchronizing pulses from the remote oscillator source is repeated at intervals sufficient to prevent excessive drift between the output of the local oscillator and the remote oscillator.

Figure 1:
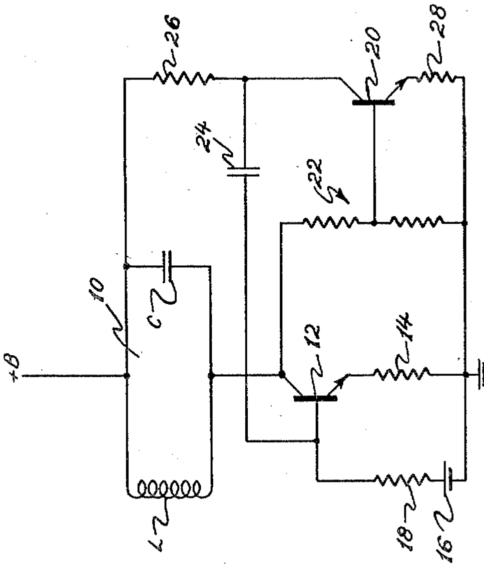
Fig. 1 is a schematic diagram of a transistorized oscillator circuit.

Referring to Fig. 1, consider a free running oscillator having a tank circuit 10 comprising an inductance L and capacitance C. Such a tank circuit will ocillate at a frequency determined by the inductance L and capacitance C as determined by the equation $$f=\frac{1}{2\pi}\times\sqrt{LC}$$

If a load in the form of a resistor is connected across this tank circuit, oscillations will tend to die out due to the damping effect of the resistor. In order to dissipate the energy of the tank circuit in the shortest possible time, as is desired in synchronizing a local oscillator in the manner of the present invention, critical damping is provided by inserting a resistance of value $$\frac{1}{2}\sqrt{\frac{L}{C}}$$

in shunt with the tank circuit.

Referring again to Fig. 1, the tank circuit 10 is connected in series with the collector-to-emitter circuit of a transistor 12, and a resistor 14. The quiescent base current of the transistor 12 is set by a battery 16 in series with a resistor 18. The resistor 18 is made very large so that the base current is substantially equal to the voltage of the battery 16 divided by the resistance of the resistor 18.

Figure 2:
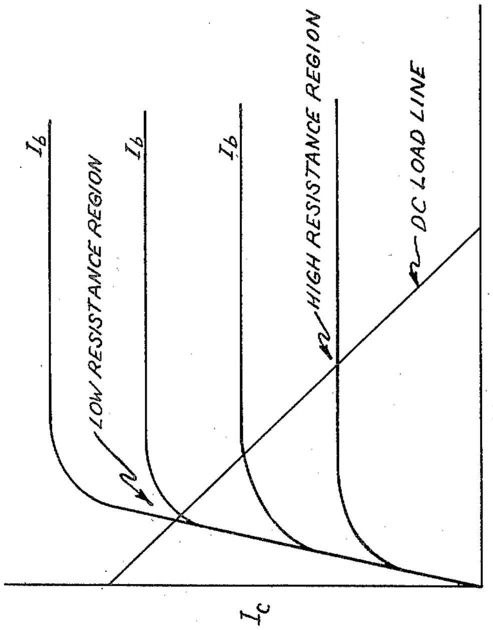
Fig. 2 shows the characteristic curves of a transistor.

Referring to Fig. 2, the grounded emitter characteristic of the transistor 12 is shown. As is evident from the characteristic curves, with a given load in series with the collector, resulting in the load line shown, for lower values of base current, collector current is substantially constant with changes in collector voltage. However, as the base current is increased, the change in collector current with change in collector voltage about the load line becomes very great. In effect, the transistor saturates and the collector-to-emitter impedance becomes very low. The collector-to-emitter impedance for a given base current is given by the reciprocal of the slope of the characteristic curve when it intersects the load line. With large base currents, the base line intersects below the lines in the characteristic curve, as evident from Fig. 2. The collector-to-emitter impedance accordingly drops to a very low value. Thus, by increasing the voltage of the battery 16, the effective resistance load across the LC tank circuit 10 can be reduced substantially to the value of the resistor 14. By making the resistor 14 substantially equal to $$\frac{1}{2}\sqrt{\frac{L}{C}}$$

the oscillation in the LC tank circuit 10 can be damped out completely in a half cycle. If after a half cycle the base current is reduced to its former value, oscillations will again be excited in the LC tank circuit 10.

The LC tank circuit 10 is driven by means of a regenerative amplifier which in effect introduces a negative resistance in series with the tank circuit 10. The regenerative amplifier is provided by means of a second transistor 20 whose base is coupled to the collector of the transistor 12 through a voltage divider 22. The voltage divider 22 establishes the proper quiescent base current in the transistor 20. The collector of the transistor 20 is coupled back to the base of the transistor 12 through a coupling condenser 24. The operating levels of the collector and emitter of the transistor 20 are set respectively by the resistors 26 and 28 connected in series with the collector-to-emitter circuit of the transistor 20 across the B+ supply. The gain around the amplifier loop, with normal operating bias on the base of the transistor 12, is sufficient to overcome the losses in the tank circuit 10 and therefore sufficient to sustain oscillation. If the base current of the transistor is suddenly increased, oscillations in the tank circuit 10 will be substantially dissipated in a half cycle. If the base current is then restored to its initial level, oscillations will resume in the tank circuit 10 starting at zero initial phase angle. Thus, the initial phase of the oscillations can be accurately set according to the time at which the base current on the transistor 12 is reduced to its normal operating level.

Figure 3:
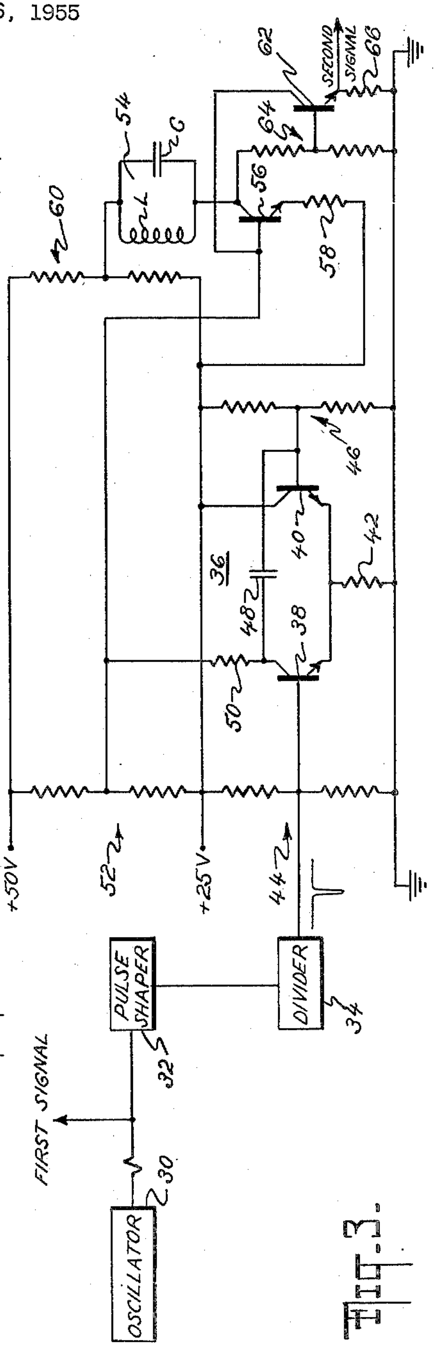
Fig. 3 is a schematic diagram of the oscillator and synchronizing circuit.

Referring to Fig. 3, there is shown a practical embodiment of the invention. The numeral 30 indicates generally a remote signal source which includes a sine wave generator of a particular frequency. The first signal from the source 30 is coupled to a pulse shaper 32 which may include a clipping circuit and differentiating circuit for deriving sharp pulses corresponding to the beginning of each cycle of the sine wave signal from the source 30. The output of the pulse shaper is coupled to a divider 34 which produces one synchronizing output pulse, for example, for each 16 cycles of the first sine wave signal.

The output of the divider 34 is coupled to a monostable multivibrator 36 which includes a pair of transistors 38 and 40 having their emitter electrodes connected through a common resistor 42 to ground. The base electrodes of the respective transistors 38 and 40 are connected to a pair of voltage dividers 44 and 46 across which is connected a twenty-five volt potential source. The dividers are designed to set the base currents to their desired operating levels. The base electrode of the transistor 40 is coupled by a condenser 48 to the collector electrode of the transistor 38. The collector electrode of the transistor 40 is connected to the twenty-five volt potential source while the collector electrode of the transistor 38 is connected through a resistor 50 to a point on a voltage divider 52. The divider 52 is connected in series with the voltage divider 44 and across a second twenty-five volt potential source.

In operation, the transistor 38 in its quiescent state is saturated by virtue of its base current level as set by the voltage divider 44. The transistor 40 in the quiescent state is cut-off by virtue of the lower base current level as set by the voltage divider 46. When a negative pulse is received from the divider 38, the base current at the transistor 38 is momentarily decreased, the potential on the collector electrode of the transistor 38 rising accordingly, and the base of the transistor 40 being raised to the point of saturation for the transistor 40. As the charge on the condenser 48 leaks off, the base of the transistor 40 slowly returns to its initial level. When the common emitter potential across the resistor 42 returns to the potential on the base of the transistor 38, the base current of the resistor 38 begins to increase, lowering the potential on the base of the transistor 40, reducing the emitter potential across the resistor 42 and further increasing the base current of the transistor 38. This regenerative process substantially instantaneously returns the transistor 38 to its saturation level and cuts off the transistor 40, completing the cycle.

For a more complete quantitative analysis of the operation of the above-described monostable multivibrator circuit 36, see the Convention Record of the I. R. E., Part II-Circuit Theory, 1954 National Convention, page 119.

A positive voltage pulse is derived from the monostable multivibrator 36 from the tap on the voltage divider 52, the time duration as determined by the constants of the multivibrator circuit being equal to a half cycle of the sine wave signal from the signal source 30. This positive pulse from the multivibrator 36 is used to gate an oscillator circuit of the type described in connection with Fig. 1.

Thus a tank circuit 54 having an inductance L and a capacitance C is connected in series with the collector electrode of a transistor 56. The positive voltage pulse from the multivibrator 36 is directly coupled to the base electrode of the transistor 56. The emitter electrode of the transistor 56 is connected through a resistor 58 to the twenty-five volt potential to establish the proper operating point for the transistor 56. A positive potential is applied across the tank circuit and transistor in series by means of a voltage divider 60 connected in parallel with the voltage divider 52.

The collector electrode of the transistor 56 is directly coupled to the base electrode of a transistor 62 through a voltage divider 64 that sets the proper operating level on the base electrode of the transistor 62. The collector electrode of the transistor 62 is coupled back to the base electrode of the transistor 56 to form a regenerative feedback loop. A sine wave output signal is derived across the resistor 66 connecting the emitter of the transistor 62 to ground.

Oscillations of the oscillator circuit, provided by the tank circuit 54 and two-stage amplifier including the transistors 56 and 62, are damped out in half a cycle by the positive pulse produced by the multivibrator 36. This positive voltage pulse increases the base current of the transistor 56 for a half cycle, saturating the transistor 56 and shunting the tank circuit 54 with effectively the resistance of resistor 58. At the end of the voltage pulse from multivibrator 36, oscillation in the tank circuit 54 resumes at a predetermined initial phase relationship to the synchronizing pulse from the divider 34.

From the above description it will be seen that the various objects of the invention have been achieved by the provision of a gated oscillator which is completely damped in half a cycle. The gated oscillator is synchronized with a remote oscillator by means of synchronizing pulses derived from the remote oscillator at frequent intervals to prevent drift between the remote oscillator and the local oscillator from becoming excessive. It will be appreciated that the frequency of the remote oscillator and the local gated oscillator need not be the same but may be integrally related. The characteristics of the transistor permit it to be used as both an amplifier stage in the oscillator and as a low impedance switch for connecting a damping resistance across the tank circuit to gate off the oscillator.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. Circuit means for generating a sine wave synchronized in phase with received synchronizing pulses, comprising a tank circuit including an inductance and capacitance, a first transistor having a collector electrode, emitter electrode and base electrode, the tank circuit being connected in series with the collector electrode of the first transistor, a resistor connected in series with the emitter electrode of the first transistor, means for applying a potential across the series connected tank circuit, first transistor, and resistor, a second transistor having a collector electrode, an emitter electrode, and a base electrode, the base electrode of the second transistor being coupled to the collector electrode of the first transistor, the collector electrode of the second transistor being coupled to the base electrode of the first transistor to provide regenerative feedback for sustaining oscillations in the tank circuit, and means coupled to the base electrode of the first transistor for increasing the base current during a predetermined time interval in response to a received synchronizing pulse including a pair of transistors, each having a collector electrode, an emitter electrode, and a base electrode, the respective emitter electrode being electrically connected together, a pair of voltage dividers connected across a potential source, the base electrodes of said pair of transistors being connected respectively to points on the voltage dividers, the base electrode of one of said pair of transistors being coupled to the received synchronizing pulses, a capacitor coupling the base electrode of the other of said pair of transistors to the collector electrode of said one of the pair of transistors, the collector electrode of said other of the pair of transistors being connected to a potential source, and a third voltage divider connected across a potential source, a resistor connecting the collector electrode of said one of the pair of transistors to a point on the third voltage divider, the base of the first transistor being connected to said point on the third voltage divider and the transistor in series with the emitter of the first transistor being connected to the low potential end of said third voltage divider.

2. Circuit means for generating a sine wave synchronized in phase with received synchronizing pulses, comprising a tank circuit including an inductance and capactance, a first transistor having a collector electrode, emitter electrode and base electrode, the tank circuit being connected in series with the collector electrode of the first transistor, a resistor connected in series with the emitter electrode of the first transistor, means for applying a potential across the series connected tank circuit, first transistor, and resistor, a second transistor having a collector electrode, an emitter electrode, and a base electrode, the base electrode of the second transistor being coupled to the collector electrode of the first transistor, the collector electrode of the second transistor being coupled to the base electrode of the first transistor to provide regenerative feedback for sustaining oscillations in the tank circuit, and means coupled to the base electrode of the first transistor for increasing the base current during a predetermined time interval in response to a received synchronizing pulse including a monostable multivibrator having a period equal in time to a half a cycle of the tank circuit and triggered by said synchronizing pulses, the monostable multivibrator being coupled to the base of the first transistor for increasing the base current to substantially reduce the collector-to-emitter impedance for the period of the multivibrator.

3. Circuit means for generating a sine wave synchronized in phase with received synchronizing pulses, comprising a tank circuit including an inductance and capacitance, a first transistor having a collector electrode, emitter electrode and base electrode, the tank circuit being connected in series with the collector electrode of the first transistor, a resistor connected in series with the emitter electrode of the first transistor, means for applying a potential across the series connected tank circuit, first transistor, and resistor, a second transistor, having a collector electrode, an emitter electrode, and a base electrode, the base electrode of the second transistor being coupled to the collector electrode of the first transistor, the collector electrode of the second transistor being coupled to the base electrode of the first transistor to provide regenerative feedback for sustaining oscillations in the tank circuit, and means coupled to the base electrode of the first transistor for increasing the base current during a predetermined time interval in response to a received synchronizing pulse.

4. Circuit means for generating a sine wave synchronized in phase with received synchronizing pulses, comprising a tank circuit including an inductance and capacitance, a first transistor having a collector electrode, emitter electrode and base electrode, the tank circuit being connected in series with the collector electrode of the first transistor, a resistor connected in series with the emitter electrode of the first transistor, means for applying a potential across the series connected tank circuit, first transistor, and resistor, means for sustaining oscillations in the tank circuit, and means coupled to the base electrode of the first transistor for increasing the base current during a predetermined time interval in response to a received synchronizing pulse including a monostable multivibrator having a period equal in time to a half a cycle of the tank circuit and triggered by said synchronizing pulses, the monostable multivibrator being coupled to the base of the first transistor for increasing the base current to substantially reduce the collector-to-emitter impedance for the period of the multivibrator.

5. Circuit means for generating a periodic signal synchronized in phase with received synchronizing pulses, comprising a tank circuit including an inductance and capacitance, a first transistor having a collector electrode, emitter electrode and base electrode, the tank circuit being connected in series with the collector electrode of the first transistor, a resistor connected in series with the emitter electrode of the first transistor, means for applying a potential across the series connected tank circuit, first transistor, and resistor, means for sustaining oscillations in the tank circuit, and means coupled to the base electrode of the first transistor for increasing the base current during a predetermined time interval in response to a received synchronizing pulse.

6. A gated oscillator controlled in response to a source of synchronizing pulses, comprising an inductive-capacitive tank circuit, means for driving said tank circuit at its resonant frequency to sustain oscillation therein, a transistor having base, emitter, and collector electrodes, a resistor having a value substantially equal to $$\frac{1}{2}\sqrt{\frac{L}{C}}$$

where L and C are respectively the inductance and capacitance values of the tank circuit, the resistor and tank circuit being connected in series with the collector and emitter electrodes of transistor across a potential source, and means including a monostable multivibrator for increasing the base current of the transistor for a half cycle interval of the tank circuit, the base current being increased in response to a synchronizing pulse above the saturation level of the transistor, whereby the tank circuit is loaded to substantially the value of the resistor.

7. A gated oscillator controlled in response to a source of synchronizing pulses, comprising an inductive-capacitive tank circuit, means for driving said tank circuit at its resonant frequency to sustain oscillation therein, a transistor having base, emitter, and collector electrodes, a resistor having a value substantially equal to $$\frac{1}{2}\sqrt{\frac{L}{C}}$$

where L and C are respectively the inductance and capacitance values of the tank circuit, the resistor and tank circuit being connected in series with the collector and emitter electrodes of transistor across a potential source, and means for increasing the base current of the transistor for a half cycle interval of the tank circuit, the base current being increased in response to a synchronizing pulse above the saturation level of the transistor, whereby the tank circuit is loaded to substantially the value of the resistor.

8. A gated oscillator controlled in response to a source of synchronizing pulses, comprising an inductive-capacitive tank circuit, means for driving said tank circuit at its resonant frequency to sustain oscillation therein, a transistor having base, emitter, and collector electrodes, the resistor and tank circuit being connected in series with the collector and emitter electrodes of the transistor across a potential source, and means for increasing the base current of the transistor for a half cycle interval of the tank circuit, the base current being increased in response to a synchronizing pulse above the saturation level of the transistor, whereby the tank circuit is loaded to substantially the value of the resistor.

No references cited.